United States Patent [19]
Jackson et al.

[11] Patent Number: 5,743,322
[45] Date of Patent: *Apr. 28, 1998

[54] METHOD FOR FORMING AN ARTICLE EXTENSION BY CASTING USING A CERAMIC MOLD

[75] Inventors: Melvin Robert Jackson; Bernard Patrick Bewlay, both of Niskayuna; Ann Melinda Ritter, Albany, all of N.Y.

[73] Assignee: General Electric Company, Schenectady, N.Y.

[*] Notice: The term of this patent shall not extend beyond the expiration date of Pat. No. 5,673,745.

[21] Appl. No.: 672,160

[22] Filed: Jun. 27, 1996

[51] Int. Cl.⁶ .................................................. B22D 19/10
[52] U.S. Cl. .................. 164/98; 29/889.1; 148/404; 164/92.1; 164/122.1
[58] Field of Search .................. 164/92.1, 98, 122.1, 164/122.2; 29/889.1, 402.07, 402.18; 148/404, 562

[56] References Cited

U.S. PATENT DOCUMENTS

| | | |
|---|---|---|
| 3,302,252 | 2/1967 | Woodburn, Jr. |
| 3,471,266 | 10/1969 | La Belle, Jr. |
| 3,967,353 | 7/1976 | Pagnotta et al. ............ 29/889.21 |
| 4,010,531 | 3/1977 | Anderson et al. ........... 29/889.721 |
| 4,033,792 | 7/1977 | Giamei et al. ............... 416/241 R |
| 4,120,742 | 10/1978 | Asano et al. ................ 204/192.17 |
| 4,869,645 | 9/1989 | Verpoort ...................... 164/98 X |
| 4,937,053 | 6/1990 | Harvey ......................... 117/210 |
| 5,193,272 | 3/1993 | Wortmann et al. .......... 29/402.07 X |
| 5,261,480 | 11/1993 | Wortmann et al. ........... 164/256 |
| 5,291,937 | 3/1994 | Corderman et al. .......... 164/92.1 |
| 5,304,039 | 4/1994 | Corderman et al. ......... 416/241 R |
| 5,611,670 | 3/1997 | Yoshinari et al. ............ 148/404 X |
| 5,673,745 | 10/1997 | Jackson et al. ............... 164/80 |

OTHER PUBLICATIONS

Metals Handbook, 9th Edition, vol. 15 ASM International (1988), pp. 399–401.
Metals Handbook, 10th Edition, vol. 1, ASM International (1990) pp. 981–994.
Metals Handbook, 10th Edition, vol. 1, ASM International (1990) pp. 995–1006.

Primary Examiner—J. Reed Batten, Jr.
Attorney, Agent, or Firm—Ernest G. Cusick; Noreen C. Johnson

[57] ABSTRACT

An extension is formed directly on an article by casting a compatible material into a ceramic mold that is attached on an end of the article, followed by cooling of the end under controlled conditions sufficient to cause an integral extension to solidify on the article. A ceramic mold is utilized over the end of the article, with a mold cavity that generally defines the shape of the extension to be formed. The mold may be formed in situ on the mandrel, or preformed and attached to the subject article over the mandrel. Extensions formed by the method of this invention have a microstructure that is continuous and compatible with that of the article. Such microstructures may include epitaxial growth of the extension from the microstructure of the article. The method establishes a temperature gradient within the article during solidification that may be further controlled by auxiliary heating and/or cooling of the article and/or extension during the practice of the method.

25 Claims, 8 Drawing Sheets

METHOD FOR FORMING AN ARTICLE EXTENSION BY CASTING USING A CERAMIC MOLD

RELATED APPLICATIONS

This application is related to commonly assigned application Ser. No. 08/672,154 filed Jun. 27, 1996 and now U.S. Pat. No. 5,673,744; application Ser. No. 08/672,156 filed Jun. 27, 1996 and now U.S. Pat. No. 5,673,745; application Ser. No. 08/669,793 filed Jun. 27, 1996 and now U.S. Pat. No. 5,676,191; and application Ser. Nos. 08/538,152 filed Oct. 2, 1995 and 08/588,587 filed Jan. 18, 1996, the contents of which are fully incorporated herein.

FIELD OF THE INVENTION

This invention relates generally to a method for providing an integral extension on an end of an article. More particularly, it is a method for providing an extension having a compatible alloy composition on an end of an article having a directionally oriented microstructure and a superalloy composition, and yet more particularly, to such a method in which an end of the article is used as a growth seed for the directional solidification of the extension directly by casting a compatible molten alloy into a ceramic mold that is attached to the end of the article and used form the extension. This method may be used to repair the tips of airfoil blading members, such as turbine blades/buckets as well as vanes/nozzles and non-airfoil articles such as turbine shrouds and combustor shingles.

BACKGROUND OF THE INVENTION

The reported technology for growing directionally oriented cast structures from superalloys has evolved from processes suitable for making simple shapes and members to processes that are currently used to form articles having complex shapes, such as the directional solidification of Ni-base superalloy blading members used in the hot sections of gas turbine engines. The published literature, such as Metals Handbook Ninth Edition, Volume 15 Casting, ASM International (1988), pp. 399–401, has many examples of processes for making directionally oriented, superalloy blading members, such as turbine blades and vanes. Most of these processes utilize some form of a withdrawal-type vacuum induction casting furnace with mold susceptor heating.

In the art of casting to produce directionally oriented superalloys, fluid pressure, such as an inert gas or air, has been applied within a closed container to a molten material, such as a metal, to force the molten material upwardly through a tube. A patent which discloses one such method and associated apparatus is U.S. Pat. No. 3,302,252, relating to continuous casting of an article upwardly through a pouring tube into a cooled mold. The cast article is continuously withdrawn from the mold.

Another portion of the casting art sometimes is referred to as the EFG (Edge-defined, Film-fed Growth) process. In that process, no external pressure is applied to a liquid material, but capillary action within a narrow forming tube or die is relied upon to draw the liquid material upwardly for solidification. Frequently, a seed crystal is introduced into the liquid to initiate crystal growth. Typical patents which disclose features of this process include U.S. Pat. Nos. 3,471,266; 4,120,742 and 4,937,053.

In some of the above referenced patents and elsewhere in the casting art relating to the formation of directionally solidified or single crystal articles, seed crystals having selected crystal orientations (primary and/or secondary orientations) have been used. They constitute a means for initiating the solidification of an article having a desired crystal orientation. In the formation of blading members, the seed crystals are also used in conjunction with casting forms, such as ceramic molds, to define the shape and crystal orientation of the member.

Heretofore, the joining of components of single crystal or directionally solidified elongated grain articles, including turbomachinery airfoils, has generally involved the use of separately cast members of selected crystal orientation. Such members are assembled and bonded into an article across an interface between the members. U.S. Pat. Nos. 3,967,355 and 4,033,792 are representative of patents relating to this type of bonding, and the '792 patent describes the desirability of matching crystal structures across the bond interface.

By using the casting technology described above, a directionally oriented article, such as a blading member, can be formed as a single crystal or with a directionally solidified crystal structure comprising a plurality of columnar grains. Both single crystal and directionally solidified articles may be formed with preferred crystal orientations, and these orientations may be formed within components so as to produce non-isotropic, orientation-related physical and mechanical properties along certain directions within the component. The desired crystal orientation in nickel-base superalloys frequently used for turbine engine components, such as blading members, is that the <001> crystallographic direction be parallel to the longitudinal axis of the member, in order to minimize the elastic modulus along the length of the member. This orientation is known to provide a good balance of the creep strength, ductility and thermal fatigue resistance of these components. Thus, these members are formed, as described herein, so that the <001> direction is the growth direction and corresponds to the longitudinal axis of the member.

An example of a blading member having a complex shape of the type described above is the turbomachinery blade described in U.S. Pat. No. 4,010,531. Such a blading member comprises an airfoil-shaped outer wall having a complex hollow interior communicating with an end region, such that gases can be circulated from the hollow interior through the outer wall and end region for cooling purposes, wherein the end region comprises a tip that extends from the end of the member.

Airfoil blading members, and other gas turbine engine components, are frequently utilized in extreme environments where they are exposed to a variety of environmentally related damage and wear mechanisms, including: erosion due to impact by high-velocity and/or high temperature airborne particles, high temperature oxidizing and/or corrosive gases, low-cycle fatigue processes and mechanical abrasion caused by rubbing against other members. These mechanisms are known to cause cracking and other damage, particularly in the end regions or tips of the blading members. Because the manufacturing costs for blading members are typically relatively high, it is often desirable to repair rather than to replace them after the tips have been damaged or worn. When superalloy blading members, or other superalloy articles having a directionally oriented microstructure, are damaged in the tip or extended end region, whether in operation or during manufacturing, the problem of their repair becomes more complicated and difficult, because of the necessity of maintaining physical and mechanical properties in the repaired portion that do not degrade the overall performance of the component. This problem of repair becomes particularly acute when a directionally oriented microstructure must be maintained in the repaired portion, as is frequently desirable in directionally oriented articles such as airfoils, because of the difficulty of replicating the original directional orientation in the materials used to make the repairs.

One method that has been used for the repair of turbine blade tips, has been to add material to the damaged or worn portion of the tip by welding, or similar processes. A disadvantage of this method is that the microstructure of the weld is not directionally oriented, and thus the mechanical properties of the tip or extension are diminished as compared to the remainder of the directionally oriented microstructure of the article. Also, most current oxidation resistant materials are difficult to weld, and have been known to crack during the welding process.

Another method has been to add separately formed tips to the end of an airfoil by brazing, welding, diffusion bonding or similar bonding processes. This method is described, for example, in U.S. Pat. Nos. 3,967,355, 4,010,531 and 4,033,792. Using such methods, it is sometimes desirable to form a crystal structure in the tip that is similar to that of the remainder of the airfoil, and to develop a microstructure in the bond that is compatible with the microstructures of both the tip and the remainder of the airfoil.

U.S. Pat. Nos. 5,291,937 and 5,304,039, which are both assigned to the assignee of this invention and are hereby incorporated by reference herein, also describe two methods for providing an extension on the end of a directionally solidified article, such as a blading member. These methods both utilize a die and a die extension made from ceramic materials, and involve applying a fluid pressure to force a molten material into the die extension. The article end on which the extension is to be formed is then placed into the die opening and die extension and into contact with the molten material. The article end is held in contact with the molten material for a time sufficient for the article end to interact with the molten material, whereupon the article is withdrawn through the die opening at a rate that permits directional solidification of an extension on the end of the article. A description is given of how these methods may be used to repair blading members, particularly their end regions and extended tips.

However, it is desirable to develop other methods of providing extensions on the ends of directionally solidified articles, such as blading members, particularly methods that do not require the apparatus described in the referenced patents, such as the ceramic die and die extension, and the means for applying fluid pressure to force the molten material into the die.

SUMMARY OF THE INVENTION

The present invention describes a method for providing an extension on an end of a superalloy article having a directionally oriented microstructure, such as a blading member or other gas turbine engine component, or other superalloy article, by casting and controlled solidification of a compatible alloy material, preferably a superalloy material, within a ceramic mold that is attached over the end of the article, followed by controlled cooling and solidification of the cast material. The article may also have internal passageways communicating through the end of the article on which the extension is to be added. An extension formed by this method may comprise a microstructure of equiaxed grains, a directionally oriented crystal structure comprising a plurality of grains or a single crystal. Further, the method may be used to provide epitaxial growth of an extension, such that the directionally oriented crystal structure of the article continues into the extension. An extension formed by this method is made by casting a compatible alloy into a ceramic mold that is attached on an end of a directionally oriented superalloy article, followed by solidification of an extension by controlled solidification of the cast material. The ceramic mold serves in part to control the shape of the extension.

In one embodiment, the invention may be briefly and generally described as a method for providing an integral extension on an article, comprising the steps of: selecting an article comprising an extension end having a cross-sectional shape, an extension bonding surface and an outer surface defined by the cross-sectional shape, the extension end also having a microstructure comprising a superalloy composition and a directionally oriented crystal structure; attaching a mandrel to the extension bonding surface, the mandrel having a cross-sectional shape that is compatible with the cross-sectional shape of the extension end and an outer surface that communicates with the outer surface of the extension end; forming a ceramic mold over the outer surface of the mandrel and at least a portion of the outer surface of the extension end, the mold having a mold cavity with a shape that is defined by the mandrel and defines the shape of an integral extension, the mold having at least one gating means that communicates with the mold cavity; removing the mandrel; casting a molten material having an alloy composition that is compatible with the superalloy composition of the article into the mold cavity through the gating means, the article and mold having been oriented prior to said casting so that the cast molten material is in contact with the extension bonding surface; heating the cast molten material with an external means for heating while holding the extension end in contact with the molten material for a time sufficient to allow a portion of the extension bonding surface to be heated by and interact with the molten material as a microstructure growth seed; and cooling the extension end under controlled thermal conditions so as to cause the molten material to solidify on the growth seed, at an interface between them that moves from the extension bonding surface into the molten material, as an integral extension that generally conforms to the shape of the mold cavity and has a microstructure that is compatible with the microstructure of the extension end, the controlled thermal conditions comprising maintaining a temperature gradient within the article such that the temperature is highest at the interface and decreases within the article as a function of increasing distance from the interface.

In a second embodiment, a preformed ceramic mold may be utilized, rather than forming the ceramic mold in situ.

Control of the temperature gradient during solidification of the extension permits control of the resulting microstructure of the extension, for example, to form a microstructure comprising a plurality of directionally solidified grains, or a single crystal microstructure. Additional control over the temperature gradient during solidification may be accomplished in this method by employing the additional steps of heating and/or cooling the article during growth of the extension.

DETAILED DESCRIPTION OF THE INVENTION

Figure 1:
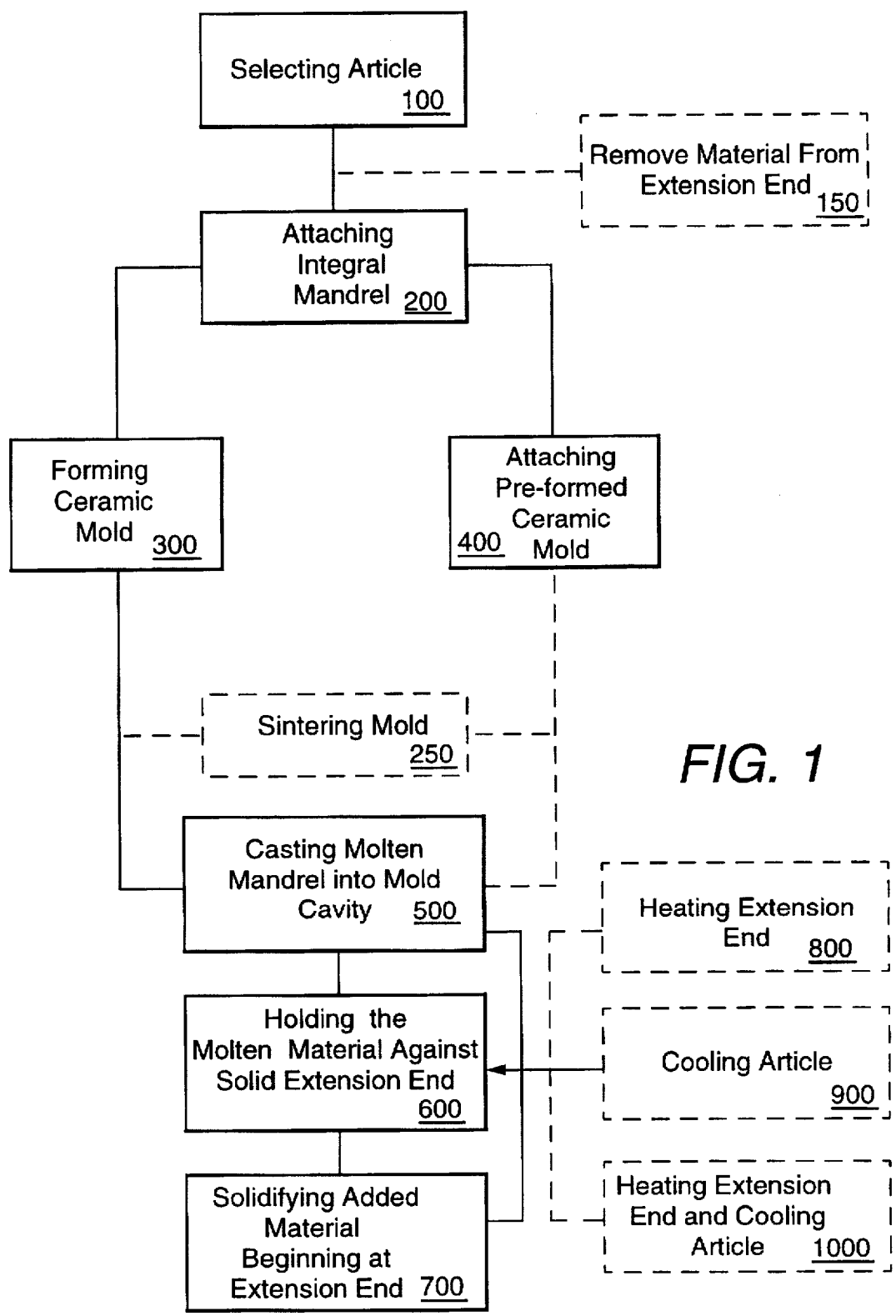
FIG. 1 is a flow diagram illustrating the method of this invention.

The present invention comprises a new method by which an extension may be grown directly on an end of a directionally oriented, superalloy article, through solidification of the extension from a molten bath of a superalloy material which is cast into the article extension end. This method also utilizes a ceramic mold to assist in forming the shape of the extension. Through use of the article itself as a seed or means for initiating growth, the method may be used to provide an extension with a crystal structure and overall microstructure that is compatible with and continuous with that of the article, including an extension having a microstructure that is generally indistinguishable from the metallurgical structure of the article from which the extension is grown. The method may be utilized to make new extensions on such articles, or to repair or replace existing extensions. While potentially useful on a wide variety of articles, the method of this invention is particularly useful in providing an extension on an article having a hollow interior and openings or passages communicating with the hollow interior through the end on which the extension is to be formed. Thus, this method is particularly useful for forming or repairing the tips of airfoil blading members, such as turbine blades.

As used herein, the term "crystal structure" is intended to mean the overall crystal morphology, such as a single crystal, multiple elongated grains and other crystal forms, and their orientations. The terms "directionally oriented", "directional orientation" or similar terms refer to strongly oriented crystal structures, including directionally solidified polycrystalline structures comprising a plurality of elongated grains, and single crystals. The term "metallurgical structure", as used herein, is intended to include such characteristics as overall chemical or alloy composition, and the size, shape, spacing and composition of precipitates, phases, inclusions, dendrites, etc. within the crystal structure. For example, Ni-base superalloys that are cast and directionally solidified generally include gamma prime precipitates, spaced dendrite arms and various other distinguishable phases, such as various carbide and carbonitride phases. The crystal structure and metallurgical structure can be determined and identified by a variety of known and widely used analytical techniques including chemical or spectrographic analysis and various x-ray, microsopic and photomicrographic methods. The term "microstructure", as used herein, comprehends both the crystal structure and the metallurgical structure.

As illustrated in FIGS. 1, 2A–C and 3A–B, the present invention is a method for providing an integral extension on an end of an article, comprising the steps (see FIG. 1) of: selecting 100 an article 2 comprising extension end 4 having a cross-sectional shape (not shown), extension bonding or growth surface 6 and outer surface 8 defined by the cross-sectional shape, extension end 8 also having a microstructure comprising a superalloy composition and directionally oriented crystal structure 10; attaching 200 mandrel 12 to extension bonding surface 6 (see FIG. 2A), mandrel 12 having a cross-sectional shape that is compatible with the cross-sectional shape of extension end 4, and outer surface 14 that communicates with outer surface 8 of extension end 4; forming 300 ceramic mold 16 over outer surface 14 of mandrel 12 (see FIG. 2B) and at least a portion of outer surface 8 of extension end 4, mold 16 having a mold cavity 18 with a shape that is defined by mandrel 12 and that is adapted to define the shape of integral extension 20, mold 16 having at least one gating means 22 that communicates with mold cavity 18; removing 180 mandrel 12 (see FIG. 2C); casting 500 molten material 26 having an alloy composition that is compatible with the superalloy composition of the article into mold 16 on extension end 4 of the article 2 through gating means 22 and contacts extension bonding surface 6; holding 600 extension end 4 in contact with molten material 26 for a time sufficient to allow a portion of extension bonding surface 6 to be heated by and interact with molten material 26 as a microstructure growth seed (see FIG. 3A); and solidifying 700 molten material 26 (see FIG. 3B) onto extension end 4 under controlled thermal conditions and at a rate which causes molten material 26 to solidify on the growth seed at interface 28 between them as integral extension 20 that conforms to the shape of mold cavity 18 and has a microstructure that is compatible with the microstructure of extension end 4, the controlled thermal conditions comprising maintaining a temperature gradient within article 2 such that the temperature is highest at interface 28 and decreases within article 2 as a function of increasing distance from interface 28.

Figure 3A:
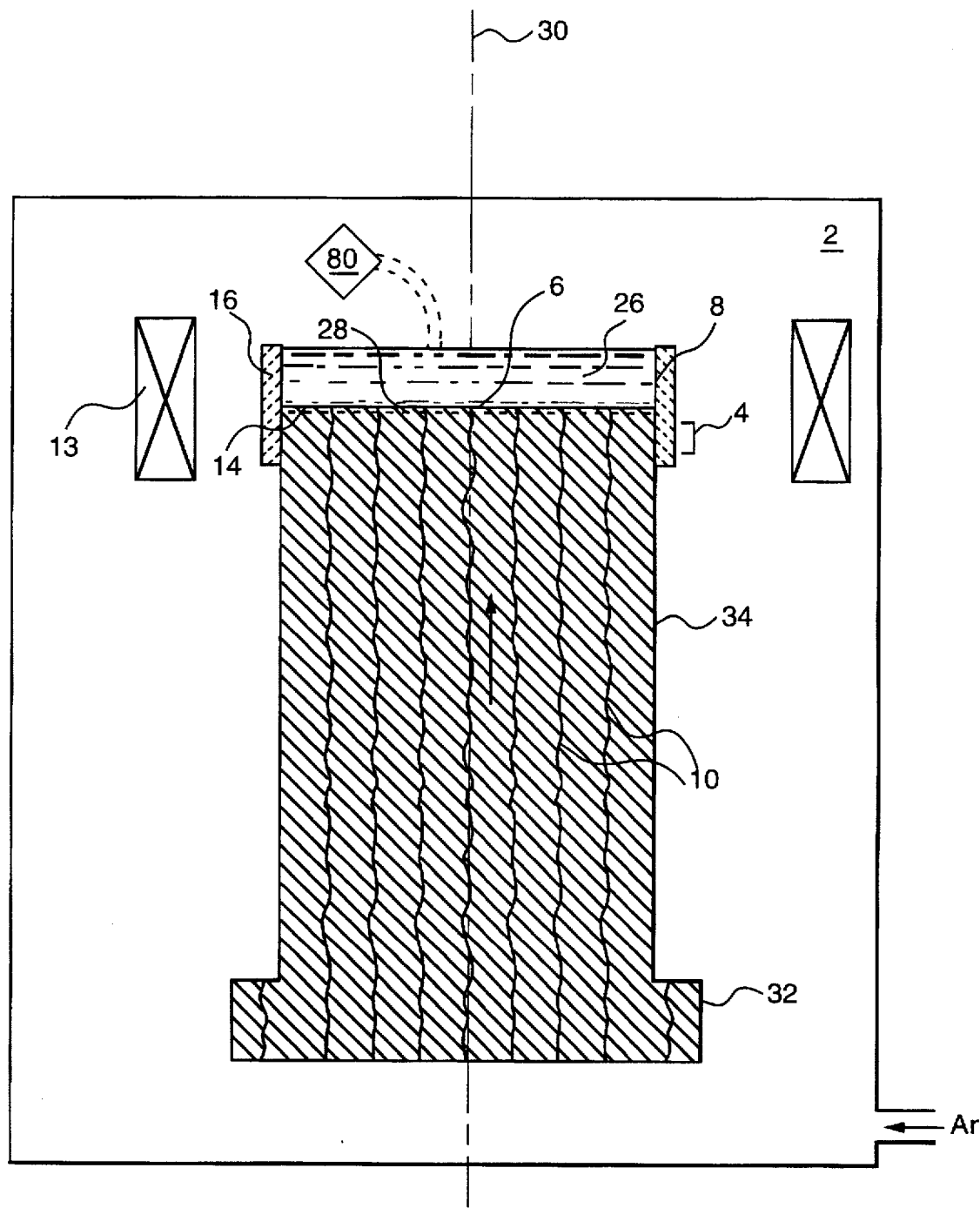
FIG. 3A is a sectional view of an apparatus adapted to practice the method of the present invention, illustrating the step of casting a molten superalloy material and holding it in a cavity consisting of a ceramic mold and the article, in accordance with this invention.
Figure 3B:
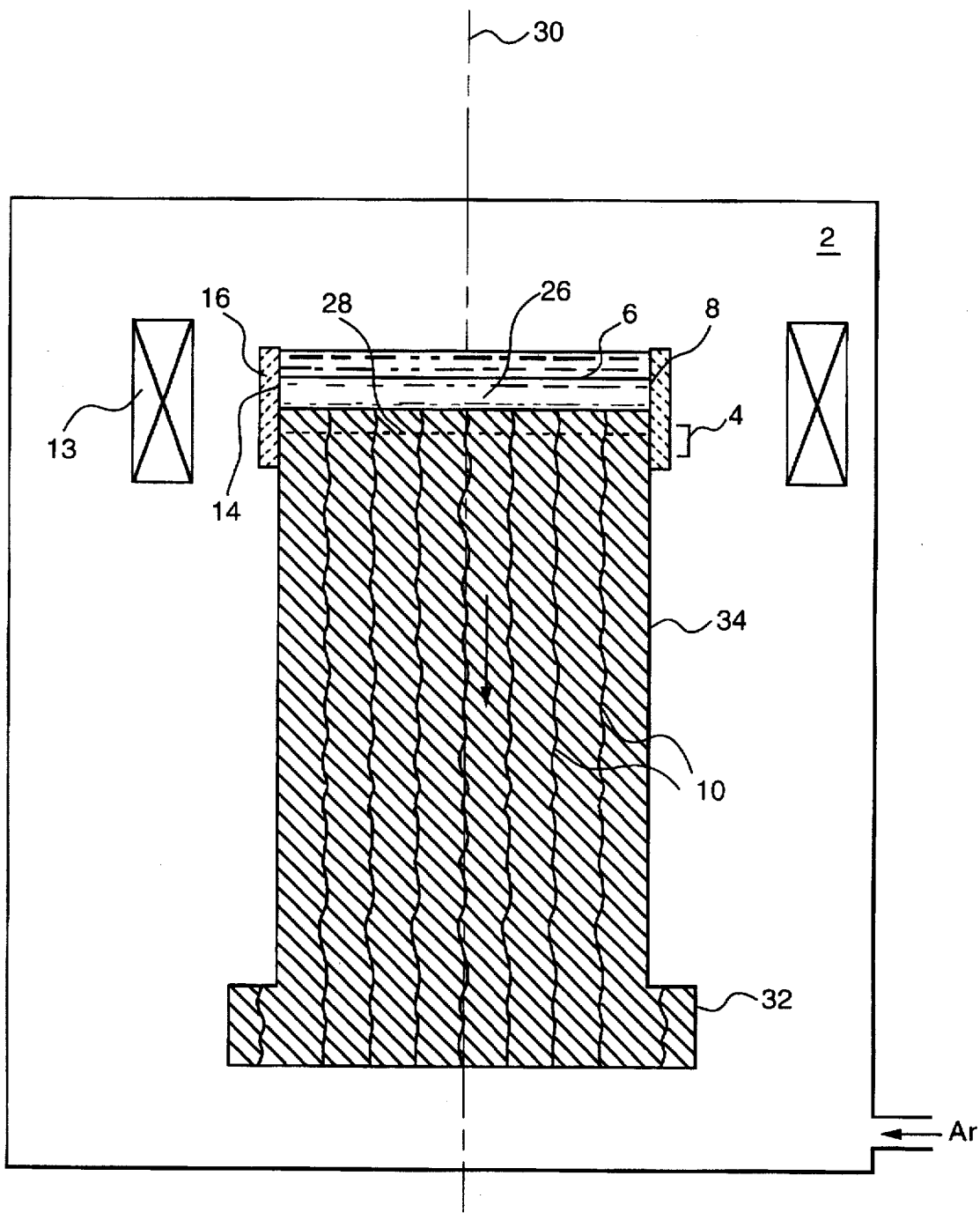
FIG. 3B is a sectional view of the apparatus of FIG. 3A, showing the step of solidifying the molten superalloy against the article which serves as a growth seed, in accordance with this invention.
Figure 4:
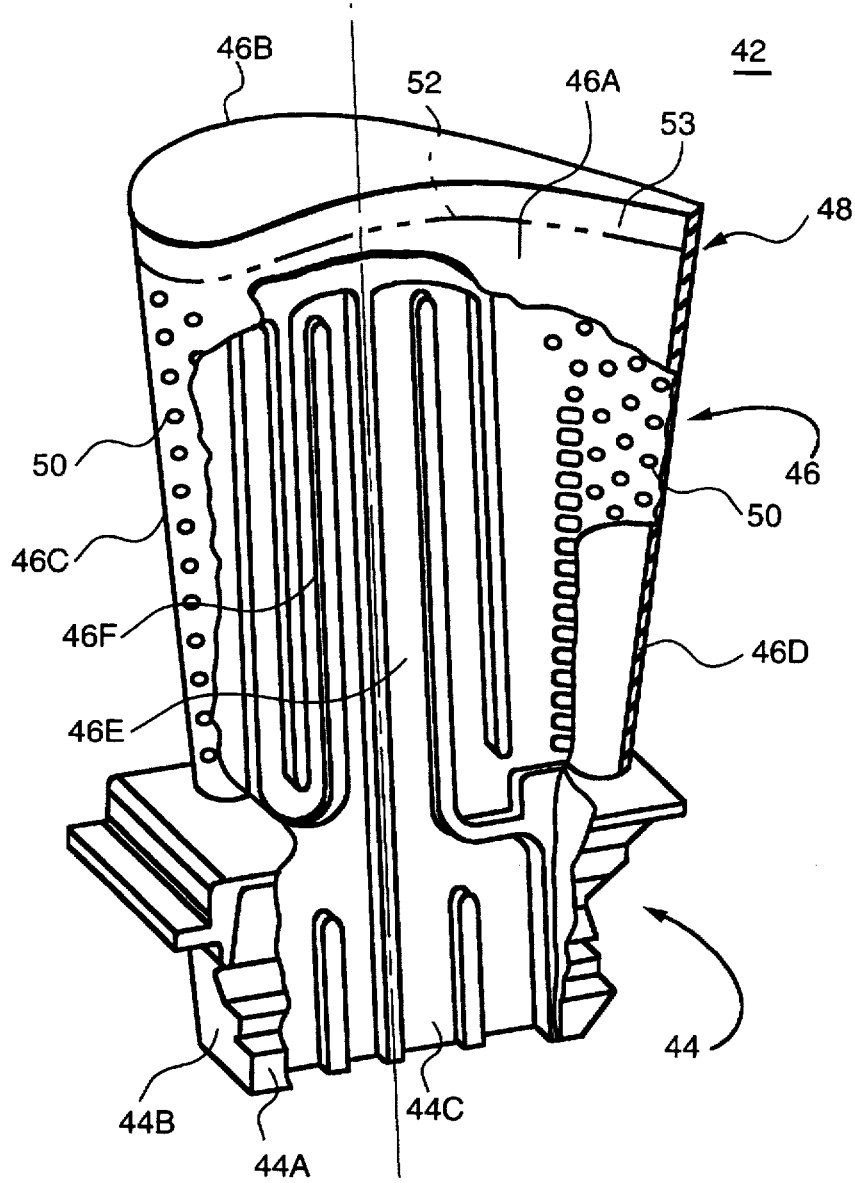
FIG. 4 is a cutaway illustration of a turbine blade for a turbine engine, including the extension end or blade tip.
Figure 5:
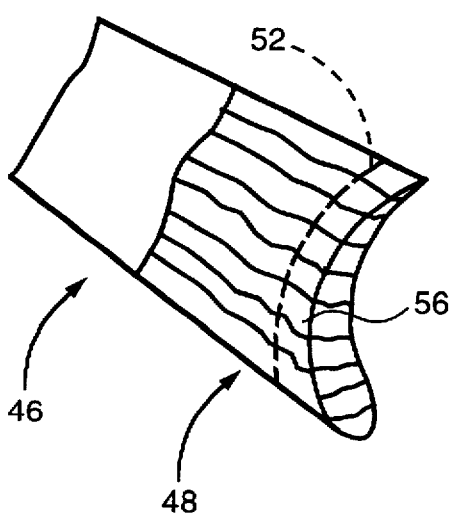
FIG. 5 is a fragmentary diagrammatic view of a repaired airfoil, shown with an extension formed according to the method of this invention, including a plurality of elongated grains.
Figure 6:
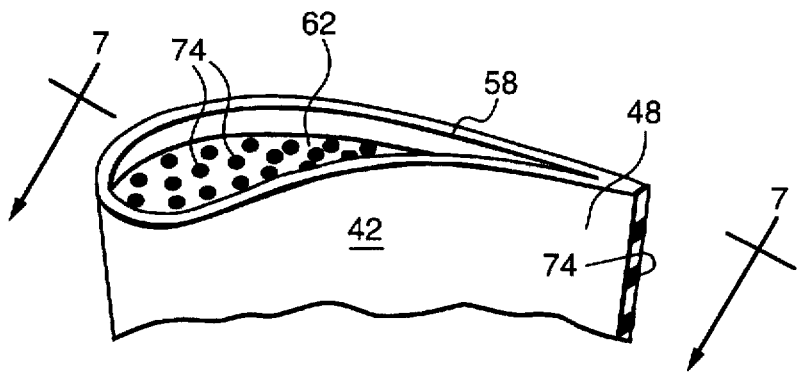
FIG. 6 is a fragmentary diagrammatic view of the blade tip portion of one example of an air cooled turbine blade.

The step of selecting 100 comprises choosing an article 2 on which an extension is to be provided. This may include selecting 100 a newly manufactured article that does not have an extension, or one which requires addition to or modification of an existing extension. It may also include selecting an article having an existing extension that has been used in an application, such as a turbine engine, and which requires modification, replacement or repair of the existing extension. An article 2 of the present invention may comprise many useful forms, but may be characterized most generally as having extension end 4 on which an integral extension 20 is to be formed having a cross-sectional shape, extension bonding surface 6 and outer surface 8. In the case of many useful embodiments of superalloy articles 2, such as gas turbine engine components, article 2 will have a general longitudinal orientation, such as about a longitudinal axis 30, as shown in FIGS. 3A, 3B and 4. For articles 2 having a longitudinal orientation, they may further be described as comprising a base end 32, transition section 34 and extension end 4, as shown in FIGS. 3A and 3B. In a preferred embodiment, article 2 comprises an airfoil, such as a blading member in the form of turbine blade 42, as shown in FIGS. 4 and 6. Turbine blade 42 comprises base or root 44, airfoil section 46 and blade tip 48, which correspond to base end 32, transition section 34, and extension end 4, respectively, as shown in FIGS. 3A and 3B. Base 44 may have many forms, but generally comprises a means for attaching blade 42 to other portions of a turbine engine such as a disk or blisk. Where blade 42 is adapted for use with a turbine disk, it generally comprises features such as a shank 44 A and dovetail portion 44B for making such attachment. Base 44 may also comprise a means for communicating with a hollow interior defined within the airfoil section, such as internal passageways or channels 44C. Airfoil section 46 of turbine blade 42 is well known, and generally comprises concave pressure sidewall 46A, and convex suction sidewall 46 B that connect leading edge 46C and chordwise spaced trailing edge 46D, and blade tip 48 that interconnects these elements at the outer end of the blade (see FIGS. 4 and 6). Airfoil section 46 also frequently has a partially hollow interior 46E, that communicates with internal passageways 44C in base 44 for the purpose, in use, of circulating a cooling fluid, such as air, from base 44 into airfoil section 46. This partially hollow interior typically comprises serpentine or labyrinthine shaped cooling channels 46F that communicate with the exterior of airfoil section 46 through passages or holes 50. Cooling channels 46F also frequently communicate with end wall 62 in the form of a plurality of small passageways 74 or holes through end wall 62. Passageways 74 are also used in the context of the use of article 42 in conjunction with the flow of a cooling fluid, such as air. Blade tip 48 is at the end of airfoil section 46 away from base 44. Referring to FIGS. 4, 5 and 6, blade tip 48 may be solid (FIG. 4), or it may comprise an end wall 62, and a peripherally extending rim 58, where rim 58 is typically on the order of 0.02–0.15 inches thick, and extends 0.02–0.25 inches beyond the outer surface of end wall 62, with the thickness and length of the extension depending on several factors, including the overall size of blade 42 (gas turbine buckets generally being much larger than jet engine blades) and the location of blade 42 within an engine. Larger buckets typically having thicker rims than those of the smaller blades. Blade tips 48 frequently become worn or damaged in service, as described herein. Thus, the method of this invention may be used to repair an extension end 4 generally, or blade tip 48 in the case of turbine blade 48, by adding an integral extension 20, whether in the form of a solid extension or the extension of a peripherally extending rim only.

In a selected article 2, extension end 4 has a cross-sectional shape that may be any useful cross-sectional shape. However, as described, the cross-sectional shape is preferably that of an airfoil, such as a turbine blade or vane, as illustrated by the perspective views of extension end 4 shown in FIGS. 4–6. Extension end 4 also comprises an extension bonding or growth surface 6. This surface is the surface from which integral extension 20 is grown using the method of this invention. Extension bonding surface 6 may have any suitable shape or size, including planar or non-planar shapes, depending on the desired shape and size of the required extension. Because this method is preferred for growing integral extensions 20 on airfoil blading members, a preferred shape would generally comprise the cross-sectional airfoil shape illustrated by rim 58 of blade tip 48, examples of which are shown in FIGS. 4–6. Extension end 4 also comprises outer surface 8 that may be any suitable shape and size. For airfoil blading members, outer surface 8 corresponds to airfoil surface 53, which corresponds to the generally complex surface of curvature described by pressure sidewall 46A and convex suction sidewall 46B that connect leading edge 46C and chordwise spaced trailing edge 46D.

A selected article 2 also has a superalloy composition and directionally oriented crystal structure 10. As used herein, the term "superalloy" is defined as any heat resisting metal alloy that is adapted for use above 540° C., and that may be processed so as to form a directionally oriented crystal structure. This includes Ni-base, Fe-base or Co-base superalloys, such as are well-known, and described, for example, in Metals Handbook Tenth Edition, Volume 1 Properties and Selection: Irons, Steels, and High-Performance Alloys, ASM International (1990), pp. 981–994 and 995–1006, which describes many castable superalloys, and specifically Ni-base superalloys that may be directionally solidified or formed as single crystals. Such superalloys are presently widely used in blading member applications. However, acceptable superalloys would also include high temperature alloys that are not presently referred to as superalloys, and are not in widespread commercial use for blading member applications, such as Nb-base and Ti-base alloys, including Nb—Ti alloys and Ti—Al alloys, as well as Ni—Al alloys. Superalloys in this context also may include those alloys that contain intrinsically or extrinsically formed strengthening media, such as composites of superalloys that contain extrinsically formed ceramic, intermediate phase or other fibers, such as Ni-base alloys that contain alumina fibers, or Nb-base composite alloys that contain an intrinsically formed Nb—Si intermediate phase.

For selected articles that have existing extensions, such as worn, oxidized or damaged turbine blades, article 2 may optionally have a portion of extension end 4 or blade tip 48 removed to facilitate the addition of new material according to the method of this invention. This is illustrated in FIG. 1 by the optional step of removing 150 a portion of extension end 4 prior to casting 500 from a reservoir 80 of a liquid molten material 26 onto extension end 4. For example, it may be desirable to remove heavily oxidized portions of a turbine blade tip to enhance the interaction with the molten material in the subsequent steps of the method. Where extension end 4 is blade tip 48, it may also be desirable to remove a portion of blade tip 48 in order to give the remainder of the tip a more uniform length or cross-section, and thereby, for example, provide a flat surface at the end of a turbine blade tip when the tip is inserted into the molten material, thus providing a more uniform surface on which to solidify the material which is to form the extension. Material could also be removed from an existing article, such as a turbine blade tip, in such a manner so as to provide a non-flat surface (e.g. sawtooth patterns, stepped patterns or other non-flat surfaces) at the end of the blade tip, and thus provide a non-uniform surface on which to solidify the material which forms the new tip. Any suitable material removal method may be used, such as grinding, sawing, machining, etching or other suitable material removal methods, provided that mechanical damage is avoided which could promote nucleation of a new grain structure during heating of the end of the article. This step may be done anytime prior to casting 500, however, it is preferred to perform removing 150 prior to attaching 200 of mandrel 12 where mechanical or physical methods of removal are to be employed, so as to avoid causing damage to mold 16.

Figure 2A:
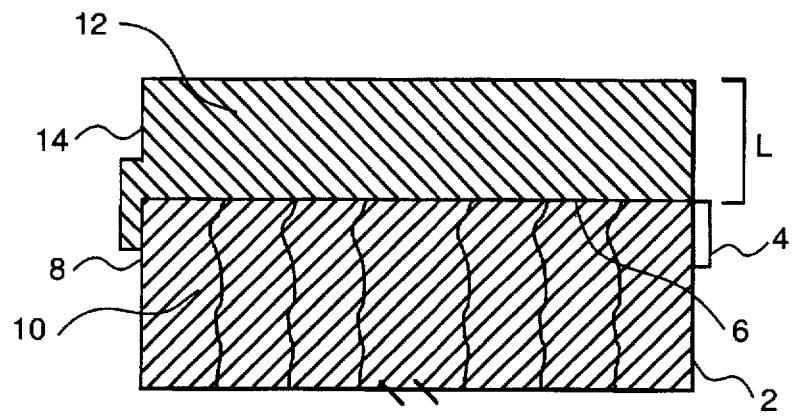
FIGS. 2A, 2B and 2C are sectional views that illustrate the steps of attaching the mandrel, forming the ceramic mold and removing the mandrel, respectively, according to the method of this invention.
Figure 2B:
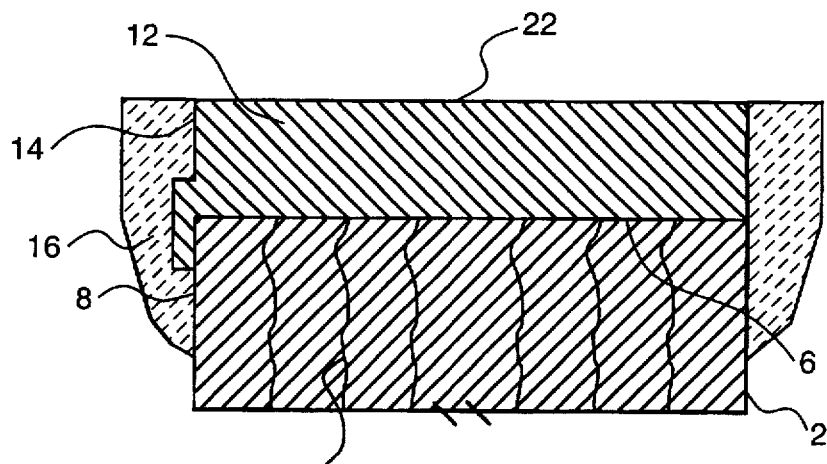
Figure 2C:
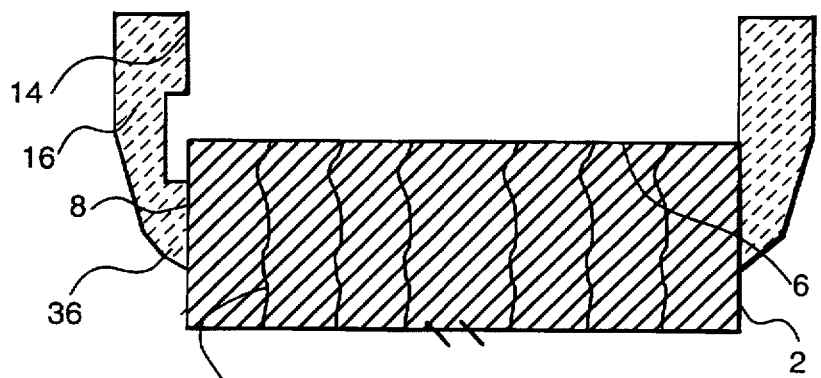

After selecting 100 and any optional removing 150, the next step is the step of attaching 200 mandrel 12 to extension bonding surface 6. Mandrel 12 may comprise any material that is compatible with extension bonding surface 6. By compatibility, it is meant that mandrel 12 must be adapted such that attaching 200 does not cause interaction with the superalloy of article 2, particularly in the region of extension bonding surface 6, that would interfere with the other steps of the method, and particularly with the interaction of extension bonding surface 6 as a microstructure growth seed in molten material 26. Also, compatibility requires that mandrel 12 be formed from a material that may be attached to extension bonding surface 6, and that the means used to make the attachment be sufficiently durable to withstand the step of forming 300. Mandrel 12 may comprise materials such as pure metals, metal alloys, polymers, waxes and salts. Attaching 200 may comprise attachment of a preformed mandrel using an attachment means such as an adhesive, or it may comprise a bonding process, such as diffusion bonding of the preformed alloy mandrel. Further, sufficient material for mandrel 12 may be added to extension bonding surface 6 in a rough form, and then mandrel 12 may be formed from the rough form using known material removal means suitable for the removal of the mandrel material utilized. As an example of attaching 200, if mandrel 12 comprises wax, the wax may be preformed and bonded to extension bonding surface 6 merely by warming this surface to soften or melt the wax sufficiently to induce bonding to the surface, followed by pressing the wax mandrel 12 onto the extension bonding surface. As a further example of attaching 200, if the material for mandrel 12 comprises a metal or metal alloy, the material may be spray formed onto extension bonding surface 6 using known means to make a rough form sufficient to form mandrel 12. Mandrel 12 may then be formed from the rough form using suitable known material removal means. The material used to form mandrel may be any material that is compatible with forming 300 the ceramic mold as well as any other steps of the method for which mandrel 12 may be utilized. Mandrel 12 has a cross-sectional shape that is compatible with the cross-sectional shape of extension end 4, as shown in FIGS. 4 and 6. Generally, a compatible cross-sectional shape may comprise the same cross-sectional shape as that of the extension end. In the case where article 2 is an airfoil, the cross-sectional shape of mandrel 12 may be an airfoil shape of the same size. However, it may be desirable that mandrel 12 have a cross-section that is the same general shape as that of the extension end 4, but of a larger size, in order to form a larger ceramic mold during forming 300. An oversize mandrel 12 would produce an oversize ceramic mold 16, which would in turn result in an oversize extension. Such an oversize configuration might be utilized if it is desirable to perform material removal or surface finishing on extension 20. Conversely, mandrel 12 could be of the same general shape as extension end 4, but undersized so as to produce an undersized extension. Such a configuration may be desirable for adding materials, such as coating layers to the outer surface of extension 20, while maintaining a cross-sectional shape that is the same as that of extension end 4. Furthermore, while it is preferred that mandrel 12 have the same general cross-sectional shape as extension end 4, any compatible cross-section may be utilized, with the compatibility of the cross-sectional shape ultimately being determined by whether the cross-sectional shape of mandrel 12 produces the desired form for extension 20. As an example, in the context of mandrels for blade tips 48, the cross-sectional shape may be that of a solid tip 48 (FIG. 4), or that of a rim 58 (FIG. 6). Mandrel 12 also has an outer surface 14 that communicates with outer surface 8 of extension end 4. This communication may be such that outer surface 14 and outer surface 8 together form a continuous, or nearly continuous surface, or there may be a discontinuity between the surfaces, as where mandrel 12 has a different cross-sectional shape or size than that of extension end 4, as described above. In the case of a discontinuity between these elements, outer surface 14 of mandrel 12 still communicates with outer surface 8 of extension end 4, albeit by a surface feature of different geometry, such as a shoulder, necked-down region or other surface that interconnects or joins these surfaces. Mandrel 12 also has a length (L), as shown in FIGS. 2A–2C. For mandrels used to form extensions on airfoils, such as buckets or blades, mandrel length typically will range from about 0.02–0.25 inches, which corresponds to the typical range in lengths of blade/bucket tips.

After attaching 200 mandrel 12, the next step is the step of forming 300 ceramic mold 16 over outer surface 14 of mandrel 12 and at least a portion of outer surface 8 of extension end 4, as shown in FIGS. 2A–2C. Ceramic mold 16 may be formed by any method that is compatible with mandrel 12 and extension end 4. Ceramic mold 16 should be formed over a sufficient portion of extension end 4 to ensure that mold 16 will not detach from extension end 4 during insertion of mold 16 into molten material 26, as described herein. Known methods include forming 300 ceramic mold from a slurry and thermal spray forming. Ceramic mold 16 may be formed from a slurry by dipping and withdrawing mandrel 12 and extension end 4 into a slurry, or by spraying a slurry over them. Ceramic molds formed from a slurry exist in a green state, and it is preferable to include an optional step of sintering 250 such molds prior to casting 500 in order to increase the density and mechanical strength of the mold. Forming 300 may also comprise thermal spray forming using well-known methods, such as plasma spraying. Molds formed by thermal spray forming typically may also be sintered, but typically such materials would have sufficient mechanical strength for use as a mold. Ceramics that may be used to form mold 16 include alumina, mullite, alumina/silica mixtures, calcia and zirconia. The ceramic material will be selected so as to ensure the compatibility of mold 16 with the superalloy of article 2 and molten material 26, particularly so as to avoid contamination of molten material 26 or extension 20. Ensuring compatibility will also seek to ensure sufficient adherence of the ceramic material to the extension end during casting 500, holding 600 and solidifying 700, in addition to ensuring sufficient mechanical strength of the mold during each of these steps, and may also involve other compatibility considerations also. Mold 16 has a mold cavity 18 with a shape that is defined, and initially occupied, by mandrel 12, as described herein. The shape of mold cavity 18 defines the shape of integral extension 20. Mold 16 may exist as one continuous piece, or a plurality of pieces, depending on the shape of mandrel 16 and how ceramic material is applied during forming 300. Mold 16 also has at least one gating means 22 that communicates with mold cavity 18. Gating means 22 permits molten material 26 to enter mold 16 and contact extension bonding surface 6. In one embodiment, gating means 22 may simply be an opening in the end of mold 16, generally having the same shape as the cross-sectional shape of extension end 4, as shown in FIGS. 2A–2C. In another embodiment, gating means 22 may be a restricted port, that serves to control or direct the flow of molten material 26 into mold cavity 18, similar to gating means used in the various casting arts. Gating means 22 may be formed during forming 300, such as by adapting mandrel 12 prior to forming so as to provide such a means during forming. For example, the mandrel could incorporate a feature that would form gating means 22 during forming 300, or a member could be added to the mandrel to provide gating means 22 during forming. Gating means 22 may also be formed by incorporating a material removal step as part of forming 300, so as to open a passageway into the mandrel after applying the ceramic material to mandrel 12 and extension end 4, or by adding a member.

After ceramic mold 16 has been formed, the next step is the step of removing 180 mandrel 12. Any suitable removal method may be used. Methods may include, for example, melting mandrel 12 and pouring the melt out of mold 16, dissolution or etching of mandrel 12, pyrolysis of carbonaceous mandrels and various mechanical removal methods. In the case where an optional step of sintering 250 is employed, removing 180 may be done either before, during or after sintering 250, depending on the material used for mandrel 12. However, for relatively low melting materials, applicants believe that it is preferable to remove mandrel 12 prior to sintering.

Figure 8:
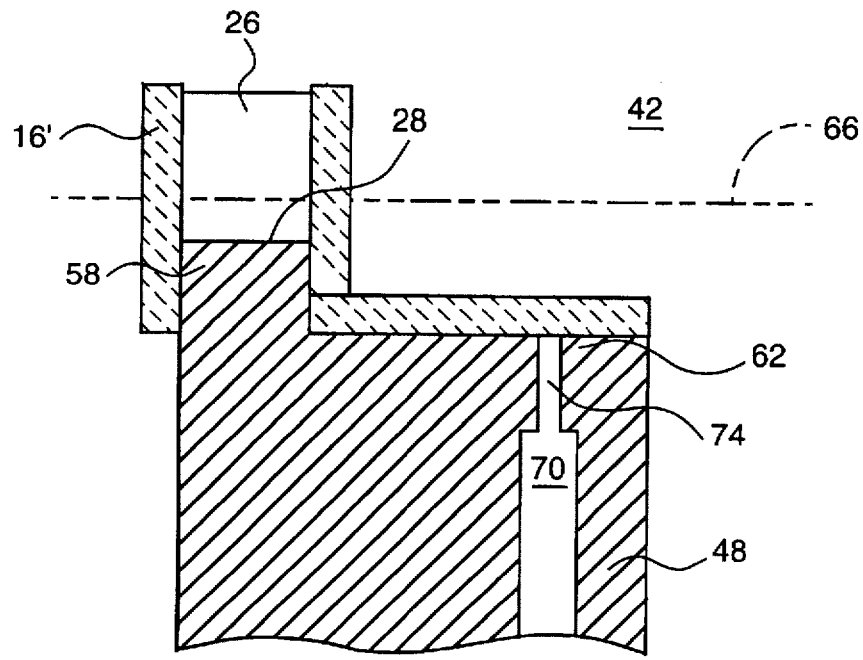
FIGS. 8, 9 and 10 are diagrammatic sectional views illustrating one embodiment of the steps of the method of the present invention on a partially hollow article.
Figure 9:
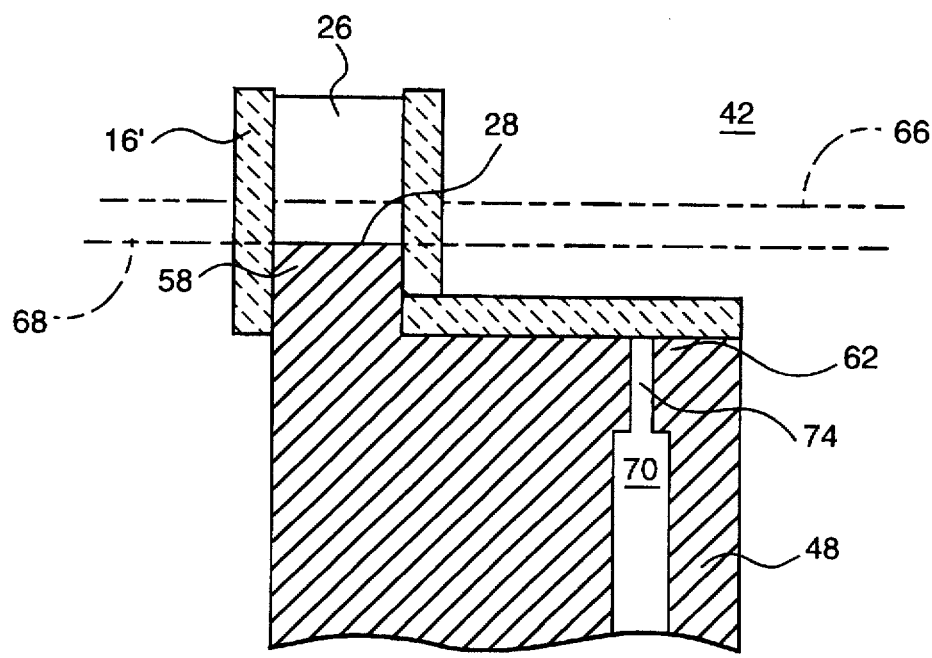
Figure 10:
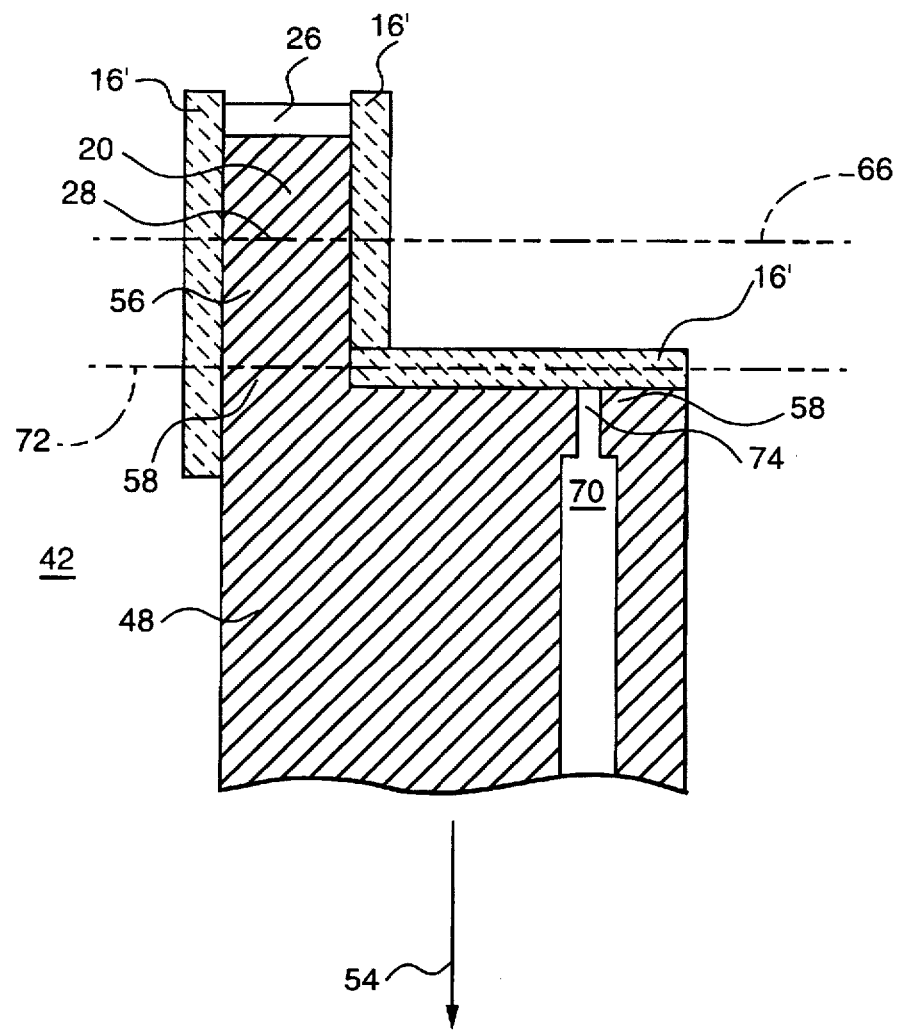

In another embodiment of the method of this invention, the steps of attaching 200, forming 300 and removing 180 may be replaced by a step of attaching 400 a preformed ceramic mold 16' over at least a portion of outer surface 8 of extension end 4, preformed mold 16' having a mold cavity 18' which at least partially encloses extension bonding surface 6 and is adapted to define the shape of integral extension 20, as illustrated in FIGS. 8-10. Mold 16' will preferably be a fully dense, sintered ceramic. The requirements of preform ceramic mold 16' are essentially the same as those for molds formed in situ, and described herein, and such molds 16' may also be made from the same ceramic materials. Preform mold 16' will also comprise at least one gating means communicating with mold cavity 18'. Mold 16' may be formed using well-known ceramic methods and apparatuses. Preformed mold 16' may be attached to extension end 4 using any suitable means for attaching; such as an interference fit; any number of mechanical attachment devices; the use of ceramic binders, slurries, cements and similar materials; or any combination thereof, depending on the properties of the ceramic and the metallic article. Such means for attaching are well known.

The method of this invention includes features not found in related art methods of forming superalloy extensions, such as those described in U.S. Pat. Nos. 5,291,937 and 5,304,039, that yielded unanticipated benefits over the prior method. For example, the method of forming the mold does not require the separate manufacture of molds and dies for each different size and shape of the desired extension. Thus this method offers flexibility to easily adapt to changes in the design of the desired extension. Further, this method permits the mold cavity, and thus the extension, to be indexed to the extension bonding surface by adjusting the size and shape of the mandrel, and how it is positioned relative to the extension bonding surface. Further, it is possible to form the mold so as to cause the mold to cover features, such as passageways, that communicate through the extension end to the interior of a hollow article, such as a blade, which avoids the necessity of the use of sacrificial or barrier materials during the formation of the extension. Additionally, using this invention, it is possible to control the entry of the molten material into the mold through the gating means, thus providing a means for controlling the way in which the molten material is introduced to the extension bonding surface, and hence the interaction of the molten material and the extension bonding surface as a microstructure growth seed.

Referring again to FIGS. 1, 3A and 3B, following the step of removing 180, and any optional step of sintering 250, the next steps are the steps of casting 500, holding 600 (see FIG. 3A) and solidifying 700 (see FIG. 3B). Casting 500 comprises heating extension end 4 of article 2, and casting from reservoir 80 molten material 26 having an alloy composition that is compatible with the superalloy composition of article 2 so that molten material 26 enters mold 16 through gating means 22 and contacts extension bonding surface 6. Casting 500 establishes intimate contact between extension end 4 and molten material 26, such that various known heat transfer mechanisms occur, and the temperature of article 2, and particularly extension end 4, rapidly begins to rise to approach the temperature of molten material 26. Casting 500 is accomplished by maintaining article 2 at extension end 4 solid below the molten material 26, with a desired depth of molten material 26 that will vary depending on numerous factors, including: the nature of the article such as its size and alloy composition, the temperature of molten material 26 and the configuration of extension end 4 (e.g. a flat versus a stepped end), wherein the maximum depth of molten material 26 will generally be limited by the amount of melt back desired on extension end 4, taking into account factors such as those noted.

Molten material 26 must have an alloy composition that is compatible with the superalloy composition of the article. Molten material 26 may be provided using any of a number of known methods, such as resistance heating, induction heating, electron beam heating, laser heating or other suitable methods. Such heating for most superalloys will preferably be done in a protective atmosphere such as argon, or in vacuum. The preferred method of providing molten material 26 of Ni-base alloys is to use a known induction heating means 13 for heating, and to perform such heating in an enclosed chamber in an argon atmosphere, as illustrated in FIGS. 3A and 3B. This apparatus has the advantage of avoiding the reaction of molten material 26 with atmospheric constituents, such as nitrogen and oxygen. The alloy composition of molten material 26 need only be compatible with the superalloy composition of the article, such that the remaining steps of the method will provide integral extension 20 on article 2, as described below. Generally, in the context of this invention, compatibility means some continuity or similarity of crystal structure, metallurgical structure, or both between the article and the extension solidified from the molten material. Compatibility also implies that neither alloy adversely affects the other, whether by depletion of alloying elements, contamination, liquid metal embrittlement, formation of brittle phases at solidification interface 28, or otherwise. Compatibility may also imply some limitation on discontinuities in mechanical and physical properties and metallurgical structure between article 2 and extension 20. Ultimately, compatibility must be measured by performance. If an extension 20 of one alloy can be repeatably grown on an article 2 of another alloy, if the article 2 with extension 20 grown thereon is amenable to subsequent manufacturing operations, and if article 2 with extension 20 performs satisfactorily in service when completed, then it must be concluded that the two alloys are compatible, exceptions to the preceding generalities notwithstanding. As used herein, the phrase "molten material compatible with . . ." is taken to mean a material or alloy that meets the preceding standard for compatibility, present in its liquid form. Since both the crystal structure and metallurgical structure of extension 20 may be different from that of article 2, a wide latitude of compatible molten materials are possible for a given article 2, depending on the degree of compatibility required between the article and the extension. For some applications, where it is desirable that the crystal structure and metallurgical structure of extension 20 closely match article 2 (e.g., cases where epitaxial growth is desired or where extension 20 must also have a directionally oriented crystal structure), the latitude will generally be narrower, such that it may be most desirable that the alloy composition of molten material 26 be the same, or very similar to, that of article 2. For other applications, where it is not necessary that either the crystal structure and metallurgical structure of the extension match the article (e.g. cases where an equiaxed crystal structure or other non-directionally oriented crystal structure is sufficient), the latitude will generally be wider, such that the alloy composition of molten alloy 26 may be quite different from that of article 2. Also, in some applications it may be desirable to develop a crystal structure and/or metallurgical structure that differs substantially from that of the article in order to develop different properties to address different requirements. For example, it may be desirable to have a lower modulus and enhanced creep and fatigue resistance in the article as compared to the extension, and to have higher wear and oxidation resistance in the extension. The composition of the superalloy of the article may be different from that of the extension grown on the article from the molten material. However, as reported in the referenced patents, different alloy compositions should be selected so that the crystal structure of the extension will grow integrally with and continuously from that of the article, despite their compositional differences. This mode of growth is sometimes termed epitaxial growth. In the context of the present invention, this would also describe a generally high degree of compatibility between the alloy of article 2 and that of extension 20. Also, it is recognized that the crystal structure or the metallurgical structure of an article, or both, may vary from base end 32 to extension end 4, and that references herein to the compatibility between the article and the extension refer principally to compatibility of extension 20 with extension end 4 of article 2.

The step of holding 600 molten the added material against the solid extension end for a time sufficient to allow a portion of extension end to be heated by and interact with molten material as a microstructure growth seed is an important, and highly variable step in the method of the invention, because the amount of interaction and the degree or extent to which the extension is to serve as a growth seed may vary considerably in accordance with this method, as described herein. For some combinations of materials, apparatus and process conditions, a sufficient time for holding 600 may be essentially zero, as may be the case, for example, where a relatively small amount of interaction between article 2 and molten material 26 is necessary to produce a continuous, integral extension 20 having a microstructure that is compatible with that of article 2 and sufficient to satisfy the requirements of its intended application. For applications where a larger amount of interaction is desirable, such as the growth of epitaxial extensions 20, it is anticipated that a sufficient time for equilibration will, for most combinations of articles and molten materials, be longer, perhaps as much as 30 minutes. For applications where longer times are expected, estimates of the time necessary can be made by calculating the time necessary to melt back the desired portion of extension end 4, using known or measured heat transfer information for article 2 and molten material 26. The amount of time for holding 600 will also be affected by the method used for casting 500, and the time utilized during this step.

It may be desirable to utilize means to enhance and control the interaction of the article and the molten material during casting 500, holding 600 or both, such as the use of supplemental heating, cooling or both, as described herein. In addition, it may be desirable to provide other known means such as stirring or other agitation within the molten material, or agitation of the article, such as by ultrasonic agitation.

Solidifying 700 is the step during which extension 20 is formed or grown on extension end 4, solidifying the molten material 26 beginning at the extension end 4. Referring to FIGS. 3A and 3B, solidifying 700 comprises reducing the temperature of the extension end 4 and molten material 26 at a rate which causes molten material 26 to solidify on the growth seed at interface 28 between them as integral extension 20 having microstructure 29 that is compatible with directionally oriented microstructure 10 of article 2, whereby during the step of solidifying 700, article 2 has a temperature gradient such that the temperature decreases between interface 28 and base end 32. Solidifying 700 may be done at any rate, either fixed or variable, that produces the desired microstructural characteristics of extension 20, as discussed further herein. The rate of solidifying 700 will depend upon the solidification characteristics of molten material 26 on article 2, and will depend upon the alloy composition of both, the temperature of molten material 26, the temperature gradient within article 2, the temperature of interface 28, and other factors. As integral extension 20 is formed at interface 28, it generally takes on the shape of mold cavity 18, except for shrinkage effects and pulling away from the mold cavity that may occur during solidification and cooling of the extension.

It is preferred that the steps of casting 500, holding 600 and solidifying 700 be done using the same apparatus. These steps may be done using any of a number of well-known melting, holding and solidifying means. A suitable casting, holding and solidifying means will typically comprise a means (not shown) for holding or gripping article 2 a means for delivering molten metal 26 from reservoir 80 to mold 16 and extension end 4; a drive means (not shown) for moving article 2 into and withdrawing it from a heating means to maintain molten material 26, that is connected to the holding means; and a means for controlling (not shown) the motion of the drive means during these steps. Article 2 may be held using any suitable means for gripping the article, such as known gripping fixtures or clamping mechanisms. Preferably, casting 500, holding 600 and solidifying 700 will be done using an automated, programmable, computer-controlled drive means, similar to those known in the art of crystal pulling, such as those used to perform the Czochralski or Bridgman solidification processes. It is also desirable that the apparatus used to contain the molten material above and in contact with article 2 be isolated to the extent possible from uncontrolled mechanical vibration. It may also be desirable that the means for controlling also be adapted to adjust the motion of the drive means based on other calculated or measured factors, either fixed or variable, such as the temperature gradient within the article, temperature of the molten material, temperature at the article/molten material interface or other factors. The steps of casting 500 and solidifying 700 may avoid movement of article 2 and molten material 26. For purposes of this method, article 2 and molten material 26, would be held stationary and the power to the heating means would be increased and subsequently decreased applicants believe that it is generally preferred to control the power rather than to control position.

An illustration of one of the possible results of the practice of one embodiment of the method of this invention is shown on airfoil section 46 of the type shown in FIGS. 4 and 5, as extension 56. Extension 56 extends from broken line 52 which designates the interface 28 within original blade tip 48 from which extension 56 comprising new blade tip 48 was grown, accounting for the melt back which occurs during these steps. As seen in the fragmentary, diagrammatic view of FIG. 5, using blade tip 48 as a growth seed results in solid extension 56 having a compatible microstructure, which in this example includes multiple elongated grains that are a continuation of, and integral with, those of the parent blade tip 48.

Figure 7:
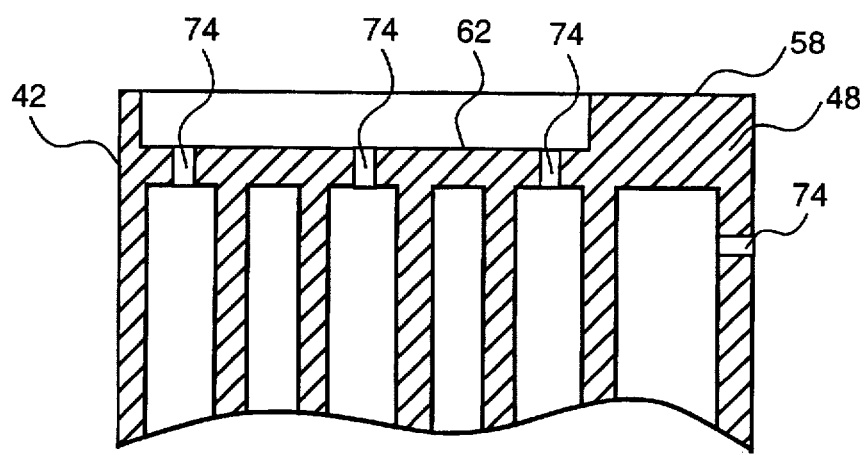
FIG. 7 is a sectional view of a portion of the blade tip of FIG. 6, taken along section line 7—7.

Another form of the tip portion of a gas turbine engine air cooled blade is shown in the fragmentary view of FIG. 6 and the sectional view of FIG. 7 taken along section line 7—7 of FIG. 6. This type of tip is sometimes referred to as a "squealer tip", because under certain operating conditions it can interfere with or rub on an opposing member to approach a zero clearance condition. As a result of such interference, peripheral rim 58 of blade tip 48 can be abraded or damaged. Even without such a rub condition, airborne particles and oxidation, over a period of operation, can abrade and contribute to the damage of rim 58. The method of the present invention can also be used to repair such damage by providing an extension in the manner described above, except that extension 56 (or extension 20 when considering the more general description of the method) in this instance may be an extension only of that portion of blade tip 48 comprising peripheral rim 58, rather than solid extension 56. In order to form the extension only on rim 58, contact of molten material with end wall 62 should be avoided.

When rim 58 is narrow, or damage extends close to end wall 62, interaction of rim 58, with molten material 26 should be limited and carefully controlled in order to avoid damage to end wall 62, particularly if end wall 62 contains features such as channels 74 or holes that communicate with a partially-hollow interior, as described herein. One embodiment of the method of the present invention provides for forming mold 16 so as to cover and protect such features, as shown in FIGS. 7–10.

The presentation of FIGS. 8–10, which are shown diagrammatically in section, shows a sequence of the practice of the method of the present invention illustrating the repair of blade 42 having a hollow interior, as shown in FIG. 7. For example, such interior can be serpentine or labyrinthine passages 70 in a fluid cooled turbine blade or vane 42. For convenience, some of the reference numerals are the same as have been used previously herein. FIG. 8 shows rim 58 in contact with and partially melted back by molten material 26 (cast from reservoir 80) from the original rim edge shown as broken line 66. In FIG. 9, melt back has continued further into rim 58 to melt back line 68, sufficient for the remaining portion of rim 58 to act as a growth seed for the solidification of molten material 26. Then blade 42 is moved down, out of the hot zone of the heating means, as shown by arrow 54 in FIG. 10, while in contact with molten material 26 until extension 56, consisting of the portion of the section above broken line 72, is grown on rim 58 by solidification from melt line 68 through continued solidification at interface 28, as described above. If blade extension 56 is solid in some part, and additional holes are desired to allow communication with the hollow interior as described herein and illustrated in FIGS. 6–10, they may be formed using known methods. For example, such holes may be formed by drilling with laser, electrochemical or electro-discharge methods well known and widely used in the art of material removal. It is contemplated by the method of this invention that if a molten material has a melting point lower than that of the article end acting as a growth seed, interaction between the molten material and growth seed need not include complete melting of the growth seed article end. All that is necessary is that a condition exist at the interface to allow crystal structure growth across the interface and into the molten material.

Referring again to FIGS. 1, 3A and 3B, the steps of casting 500, holding 600, and solidifying 700 extension end 4 from molten material 26 establishes a temperature gradient within article 2 that may be viewed as a gradient between interface 28 and base end 32, wherein the temperature at a given location within article 2 decreases from interface 28 to base end 32. The temperature gradient within a given article 2 will be a function of the temperature of molten material 26; the thermal conductivity of article 2; the configuration, including internal passages within article 2; the rate of withdrawal of article 2 and other factors, including the configuration of the apparatus used to perform this method and the presence of external sources of heating or cooling that may be applied to article 2 during these steps. As is well known in the art of solidification of molten materials, such as superalloys, the thermal gradient of the interface where the solidification is taking place effects the microstructure of the resultant article. For superalloys, relatively shallow thermal gradients, on the order of 10° C./cm, tend to produce less directional orientation and more equiaxed grain structures, due to perturbations resulting in non-unidirectional heat flow. Steeper thermal gradients from, for example, 25°–150° C./cm, tend to produce conditions at the interface which promote the dendritic solidification of molten material 26 at interface 28. The temperature gradient within article 2, and particularly at the extension end and in the vicinity of interface 28, also affects the nature of the dendritic growth, including the spacing of the primary and secondary dendrites. Control of the temperature gradient at interface 28 is particularly important when it is desirable to produce particular directional morphologies and orientations, either polycrystalline directional solidification or single crystal growth, within the extension. The method of this invention may also include the use of optional steps to alter the temperature gradient within article 2. These steps may include: heating 800 the extension end of the article with an external (other than by conduction from molten material 26) means for heating, removing heat 900 from the article using an external means for cooling the article, or simultaneously heating the extension end of the article with an external means for heating while also cooling 1000 the article with an external means for cooling at a location other than the extension end. These optional steps may be used with any or all of the steps of casting 500, holding 600, and solidifying 700 described herein. External means for heating are well known, such as the use of a separate induction coil positioned so as to heat the extension end of the article. External cooling means are also well known in the art of solidification, including the use of chills such as water-cooled chills, metal chill plates or other means. Such cooling means would commonly be attached to base end 32 or transition section 34 of article 2, however, a chill may also be attached to the extension end in circumstances where a heating means is not being utilized on this portion of the article. The use of these steps may be used to control the temperature gradient at both the interface and within the article.

It may be desirable for some configurations of article 2 and combinations of the steps of this method, to repeat the steps of casting 500, holding 600, and solidifying 700 article 2, with the same molten material or a different alloy composition, in addition to the repetition of the optional steps noted of material removal and/or heating or cooling in conjunction with these steps.

Referring again to FIGS. 3A and 3B, it will also be recognized by those skilled in the art of solidification from a molten material, that the surfaces of an extension formed using this method will generally be in an unfinished form, and will, therefore, frequently require the use of additional material removal, surface finishing steps, such as grinding, machining, polishing or other material removal and/or surface finishing steps, or spray forming of a ceramic coating, in order to produce a finished extension.

EXAMPLE 1

An existing blading member in the form of a turbine blade made from an alloy composition of Ni-13.7 Al-7.9 Cr-12.3 Co-2.1 Ta-0.1 B-0.9 Mo-1.6 W-0.9 Re-0.6 C-0.5 Hf excepting impurities, in atom percent, was used as an article for the purpose of forming an extension according to the method of this invention. In this evaluation, it was desired to add an extension to the airfoil section of a turbine blade to simulate the repair of a tip as shown in FIGS. 3–10, and described herein. The microstructure of this cast blade comprised a plurality of directionally solidified grains, similar in orientation to those illustrated in FIG. 4. The material used as the molten material had nominally the same alloy chemistry as that of the blade. A charge of this Ni-base superalloy was placed in a water-cooled, copper crucible that was located within a chamber that was adapted to be filled with argon gas. The chamber was filled with argon, and the alloy was melted in the crucible. The superalloy charge was melted in the crucible by use of an induction heating means, and heated to a temperature of 1400° C. The article was positioned within a holding means comprising a bolt to which the article was welded that was in turn attached to a drive means comprising a threaded drive rod with a digital encoder, for casting, holding, and solidifying the article. The drive means was interconnected to a means for controlling the motion of the drive means, comprising a computer-based controller, that was adapted to control the depth of insertion of the article into the extension end of the molten material, the hold time, and the rate of withdrawal. During this period, the blade interacted with the melt by melting back the inserted portion. Furthermore, the blade then acted as an oriented growth seed for solidification of the extension from the superalloy melt. The blade was then withdrawn by moving it out of the melt, at a rate of approximately 10 mm/min. Withdrawal and directional solidification was continued until an extension of about 6 mm/min. had been solidified. This allowed an extension to solidify having the same polycrystalline directionally solidified crystal structure as the blade. The extension was continuous and integral with the extension end of the article.

The article generated from the practice of this invention included a base and a partially hollow airfoil section having an outer cross-section. It did not contain a blade tip of a type described herein, only because it did not have an end wall. However, the configuration was such that the walls of the airfoil section had a thickness of approximately 6 mm, which closely approximates the peripheral rim in a typical turbine blade having an end wall as described herein. Therefore, this example closely approximates the microstructure and geometry of typical turbine blade tips, and serves to demonstrate the method of this invention for the growth or repair of such tips. The article used had a first crystal structure in the airfoil section comprising a plurality of directionally oriented elongated grains, and a first metallurgical structure based on the alloy composition of the article. Integral and continuous with the airfoil section was an extension having a second crystal structure as a continuation of and compatible with the first crystal structure of the airfoil section, and also having a second metallurgical structure that was also continuous and compatible with, but somewhat distinguishable from, the first metallurgical structure due to a slightly different dendrite arm spacing resulting from different thermal gradients used to grow the original article and the new blade end. While this example did not include the use of a ceramic mold, the solidification process described in the example is illustrative of the solidification processes which occur when a ceramic mold is used. The ceramic mold defines the shape of the solidified extension.

The interface portion between the airfoil section and the extension is different from those reported for related art methods, such as the diffusion bonding together of matched, separately generated, distinct members. It was similar in some respects to the interface described in the related art referenced patents that describe the continuous casting of blade tips. However, no means is necessary for applying a fluid pressure to the molten material in the method of this invention. The principal distinction between the present invention and much of the related art lies at the interface. In the present example, the extension may be grown epitaxially by laying down one layer of atoms after another from the molten material selected for the extension onto the surface of the article. Thus, the grains of the extension may be continuous with those of the article across the interface between them. The method of the present invention further allows the secondary grain (dendrite) orientation to be grown, unlike the prior art interface bonding techniques for which such secondary grain orientation is difficult to match in the transverse direction. An epitaxially grown region, or repaired area, may be formed that matches the original metallurgical grain structure or orientation of the article not only in the primary, but also the secondary direction. The advantage over most related repair methods which have equiaxed grains at the interface and in the repaired area is significant in terms of mechanical and metallurgical properties, since the metallurgical grain structure of the original article does not match the extension or repaired area by use of most related art methods. Even where different alloys are selected for the body and extension, it is anticipated that there will generally be a gradation in metallurgical structure in the interface region as a result of rapid mixing of atomic species in the liquid adjacent to the solidified structure. Even though most related art methods are practiced with great care, there is a high likelihood of local surface irregularities and small misalignments between the body and a separate extension that may result in some sort of low angle boundary between the two parts. Likewise, there is a high likelihood that contaminating matter on either part will become trapped in the interface, thereby weakening the joint. Additionally, the related art practices for repairing such an article usually and disadvantageously close the passageways as the molten metal flows into them and solidifies. Additional machining operations then are required to reopen the passageways.

The preceding example demonstrated that controlled growth of extensions, of the type that would be required in airfoil blade tip repair, with similar cross-section as the parent airfoil, can be accomplished. Although this example included only one extension, it should be understood that the present invention can be expanded to include the concurrent growth of multiple extensions, such as a multiple turbine blade tips. The present invention may also be used for repair of other directionally oriented articles having passageways such as airfoil vanes.

As also noted in the referenced patents, although it was concluded that the crystal structure of the extension should be substantially the same as that of the existing article, it was unexpectedly found that considerable variation in metallurgical structure, notably alloy composition, between the extension and existing article is permissible, and may even be preferable in some cases. This result may also be applied to the utilization of the method of applicants' invention.

The method of this invention has unexpected advantages over related methods for providing extensions for articles, such as airfoils, in several respects. Welded extensions must have compositions, melting characteristics, flow characteristics and potentially other properties that facilitate the use of the welding processes used to form them, and thus frequently have compositions that differ from the compositions of the articles to which they are added. Also, welded extensions typically have an equiaxed microstructure due to the nature of the welding processes used to form them, and thus do not form the directionally oriented microstructures that are possible with the method of this invention. Diffusion bonded or other bonded extensions are known to have interfaces that frequently contain defects, such as voids and/or low angle grain boundaries, as described herein. Thus, the interface between the extension and article may be weaker than desirable for certain applications. Related methods for casting extensions that are also referenced herein, utilize different forming methods that require the use of additional devices such as ceramic dies, die extensions and means for pressurizing the molten bath from which they are formed, that are not required for utilizing the method of the present invention. The fact that extensions having the desirable microstructural features described herein may be formed without the use of such additional devices, thereby reducing cost of forming such extensions and avoiding the potential for contamination by such devices, is a significant and unexpected advantage over these related art methods of casting extensions.

The foregoing embodiments have been disclosed for the purpose of illustration of the present invention, and are not intended to be exhaustive of the potential variations thereof. Variations and modifications of the disclosed embodiments will be readily apparent those skilled in the art. All such variations and modifications are intended to be encompassed by the claims set forth hereinafter.

What is claimed is:

1. A method for providing an integral extension on an article, comprising the steps of:

selecting an article comprising an extension end having a cross-sectional shape, an extension bonding surface and an outer surface defined by the cross-sectional shape, the extension end also having a microstructure comprising a superalloy composition and a directionally oriented crystal structure;

attaching a mandrel to the extension bonding surface, the mandrel having a cross-sectional shape that is compatible with the cross-sectional shape of the extension end and an outer surface that communicates with the outer surface of the extension end;

forming a ceramic mold over the outer surface of the mandrel and at least a portion of the outer surface of the extension end, the mold having a mold cavity with a shape that is defined by the mandrel and defines the shape of an integral extension, the mold having at least one gating means that communicates with the mold cavity;

removing the mandrel;

casting a molten material having an alloy composition that is compatible with the superalloy composition of the article into the mold cavity through the gating means, the article and mold having been oriented prior to said casting so that the cast molten material is in contact with the extension bonding surface;

heating the cast molten material with external means for heating while holding the extension end in contact with the molten material for a time sufficient to allow a portion of the extension bonding surface to be heated by and interact with the molten material as a microstructure growth seed; and cooling the extension end under controlled thermal conditions so as to cause the molten material to solidify on the growth seed, at an interface between them that moves from the extension bonding surface into the molten material, as an integral extension that generally conforms to the shape of the mold cavity and has a microstructure that is compatible with the microstructure of the extension end, the cooling under controlled thermal conditions comprising maintaining a temperature gradient within the article such that the temperature is highest at the interface and decreases within the article as a function of increasing distance from the interface.

2. The method of claim 1, wherein the article comprises a component of a gas turbine engine.

3. The method of claim 2, wherein the component comprises an airfoil.

4. The method of claim 3, wherein the airfoil comprises a blading member comprising longitudinal axis, a root, a tip having an airfoil shaped cross-section normal to the longitudinal axis, a tip bonding surface and a tip airfoil surface, and an airfoil section which joins the root and the tip, and wherein the tip corresponds to the extension end, the tip bonding surface corresponds to the extension bonding surface, the tip airfoil surface corresponds to the outer surface and the airfoil shaped cross-section corresponds to the cross-sectional shape.

5. The method of claim 1, wherein the molten material and the article comprise at least one of Ni-base, Fe-base, Co-base, Ti-base, and Nb-base superalloys.

6. The method of claim 1, wherein the mandrel comprises a material selected from the group consisting of pure metals, metal alloys, polymers, waxes and salts.

7. The method of claim 1, wherein said step of forming the ceramic mold comprises at least one of slurry forming and thermal spray forming.

8. The method of claim 7, further comprising an additional step of sintering the ceramic mold prior to said step of casting.

9. The method of claim 1, wherein the ceramic comprises at least one of alumina, mullite, alumina/silica mixtures, calcia and zirconia.

10. The method of claim 1, further comprising a step of heating the extension end of the article with external means for heating during any of said steps of casting, heating or cooling, in order to control the temperature gradient at the interface and within the article.

11. The method of claim 1, further comprising a step of cooling the extension end of the article with external means for cooling during any of said steps of casting, heating or cooling in order to control the temperature gradient at the interface and within the article.

12. The method of claim 1, further comprising a step of heating the extension end of the article with external means for heating and also a step of cooling the article at a location other than the extension end of the article with external means for cooling during any of said steps of casting, heating or cooling, wherein both steps are performed in order to control the temperature gradient at the interface and within the article.

13. The method of claim 1, wherein the integral extension comprises a directionally oriented microstructure.

14. The method of claim 13, wherein the directionally oriented microstructure of the integral extension substantially comprises an epitaxial extension of the directionally oriented microstructure of the extension end of the article.

15. A method for providing an integral extension on an article, comprising the steps of:
- selecting an article comprising an extension end having a cross-sectional shape, an extension bonding surface and an outer surface defined by the cross-sectional shape, the extension end also having a microstructure comprising a superalloy composition and a directionally oriented crystal structure;
- attaching a preformed ceramic mold over at least a portion of the outer surface of the extension end, the mold having a mold cavity which at least partially encloses the extension bonding surface and defines the shape of an integral extension, the mold also having at least one gating means communicating with the mold cavity;
- casting a molten material having an alloy composition that is compatible with the superalloy composition of the article into the mold cavity through the gating means, the article and mold having been oriented prior to said casting so that the cast molten material is in contact with the extension bonding surface;
- heating the cast molten material with external means for heating while holding the extension end in contact with the molten material for a time sufficient to allow a portion of the extension bonding surface to be heated by and interact with the molten material as a microstructure growth seed; and
- cooling the extension end under controlled thermal conditions so as to cause the molten material to solidify on the growth seed, at an interface between them that moves from the extension bonding surface into the molten material, as an integral extension that generally conforms to the shape of the mold cavity and comprises a microstructure that is compatible with the microstructure of the extension end, the cooling under controlled thermal conditions comprising maintaining a temperature gradient within the article such that the temperature is highest at the interface and decreases within the article as a function of increasing distance from the interface.

16. The method of claim 15, wherein the article comprises a component of a gas turbine engine.

17. The method of claim 16, wherein the component comprises an airfoil.

18. The method of claim 17, wherein the airfoil comprises a blading member comprising longitudinal axis, a root, a tip having an airfoil shaped cross-section normal to the longitudinal axis, a tip bonding surface and a tip airfoil surface, and an airfoil section which joins the root and the tip, and wherein the tip corresponds to the extension end, the tip bonding surface corresponds to the extension bonding surface, the tip airfoil surface corresponds to the outer surface and the airfoil shaped cross-section corresponds to the cross-sectional shape.

19. The method of claim 15, wherein the molten material and the article comprise at least one of Ni-base, Fe-base, Co-base, Ti-base, and Nb-base superalloys.

20. The method of claim 15, wherein the ceramic comprises at least one of alumina, mullite, alumina/silica mixtures, calcia and zirconia.

21. The method of claim 15, further comprising a step of heating the extension end of the article with external means for heating during any of said steps of casting, heating or cooling in order to control the temperature gradient at the interface and within the article.

22. The method of claim 15, further comprising a step of cooling the article with external means for cooling during any of said steps of casting, heating or cooling in order to control the temperature gradient at the interface and within the article.

23. The method of claim 15, further comprising a step of heating the extension end of the article with external means for heating and also a step of cooling the article at a location other than the extension end of the article with external means for cooling during any of said steps of casting, heating or cooling, wherein both steps are performed in order to control the temperature gradient at the interface and within the article.

24. The method of claim 15, wherein the integral extension comprises a directionally oriented microstructure.

25. The method of claim 24, wherein the directionally oriented microstructure of the integral extension substantially comprises an epitaxial extension of the directionally oriented microstructure of the extension end of the article.

* * * * *